United States Patent
Son et al.

(10) Patent No.: US 11,259,417 B2
(45) Date of Patent: Feb. 22, 2022

(54) EMBEDDED-TYPE TRANSPARENT ELECTRODE SUBSTRATE AND METHOD FOR MANUFACTURING SAME

(71) Applicant: LG CHEM, LTD., Seoul (KR)

(72) Inventors: Yong Goo Son, Daejeon (KR); Kun Seok Lee, Daejeon (KR); Jung Ok Moon, Daejeon (KR); Kiseok Lee, Daejeon (KR); Seung Heon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/755,540

(22) PCT Filed: Mar. 11, 2019

(86) PCT No.: PCT/KR2019/002782
§ 371 (c)(1),
(2) Date: Apr. 10, 2020

(87) PCT Pub. No.: WO2019/177319
PCT Pub. Date: Sep. 19, 2019

(65) Prior Publication Data
US 2021/0195760 A1   Jun. 24, 2021

(30) Foreign Application Priority Data
Mar. 14, 2019 (KR) .................. 10-2018-0029686

(51) Int. Cl.
*H05K 1/02* (2006.01)
*H05K 1/03* (2006.01)
(Continued)

(52) U.S. Cl.
CPC .......... *H05K 3/386* (2013.01); *H05K 1/0274* (2013.01); *H05K 3/389* (2013.01); *H05K 3/067* (2013.01); *H05K 2203/1453* (2013.01)

(58) Field of Classification Search
CPC .. H05K 1/02; H05K 1/03; H05K 1/09; H05K 1/11; H05K 1/185; H05K 3/00;
(Continued)

(56) References Cited

U.S. PATENT DOCUMENTS 5,223,083 A * 6/1993 Cathey ................ H01L 21/0274
257/E21.008
6,190,834 B1 * 2/2001 Narahara .............. C08F 290/14
430/284.1
(Continued)

FOREIGN PATENT DOCUMENTS

CN    103081157 A    5/2013
CN    103477399 A    12/2013
(Continued)

OTHER PUBLICATIONS

Zhou et al., "High-Performance Flexible Organic Light-Emitting Diodes Using Embedded Silver Network Transparent Electrodes," ACS Nano, vol. 8, No. 12, 2014, p. 12796-12805, 10 pages total.
(Continued)

*Primary Examiner* — Xiaoliang Chen
(74) *Attorney, Agent, or Firm* — Birch, Stewart, Kolasch & Birch, LLP

(57) ABSTRACT

A method of manufacturing a transparent electrode substrate according to an exemplary embodiment includes: a) forming a structure including a transparent base, a bonding layer on a surface of the transparent base, and a metal foil on a surface of the bonding layer opposite the transparent base; b) forming a metal foil pattern by patterning the metal foil; c) heat-treating the structure resulting from b) at a temperature of 70° C. to 100° C.; and d) completely curing the bonding layer. Also, a transparent electrode substrate is disclosed.

9 Claims, 4 Drawing Sheets

(51) Int. Cl.
    *H05K 1/09*       (2006.01)
    *H05K 1/11*       (2006.01)
    *H05K 3/00*       (2006.01)
    *H05K 3/02*       (2006.01)
    *H05K 3/10*       (2006.01)
    *H05K 3/20*       (2006.01)
    *H05K 3/22*       (2006.01)
    *H05K 3/28*       (2006.01)
    *H05K 3/40*       (2006.01)
    *H01L 21/20*      (2006.01)
    *H01L 21/30*      (2006.01)
    *H05K 3/38*       (2006.01)
    *H05K 3/06*       (2006.01)

(58) Field of Classification Search
    CPC .. H05K 3/02; H05K 3/10; H05K 3/20; H05K 3/22; H05K 3/28; H05K 3/40; H01L 21/20; H01L 21/30
    USPC ....... 174/268, 251, 255, 256, 260, 261, 262, 174/264; 156/154, 247, 250, 291; 438/29, 99, 151, 199, 701; 29/825, 829, 29/846, 848
    See application file for complete search history.

(56) References Cited

U.S. PATENT DOCUMENTS

| | | | |
|---|---|---|---|
| 8,309,638 B2* | 11/2012 | Ishimatsu | C08L 33/24 524/159 |
| 2002/0038725 A1* | 4/2002 | Suzuki | H05K 1/0373 174/262 |
| 2002/0164469 A1* | 11/2002 | Hanai | C04B 35/63424 428/210 |
| 2003/0024110 A1* | 2/2003 | Fujii | H05K 3/28 29/829 |
| 2004/0071962 A1* | 4/2004 | Tanimoto | H01G 9/06 428/343 |
| 2004/0229024 A1 | 11/2004 | Harada et al. | |
| 2005/0074695 A1* | 4/2005 | Nakamura | H01L 21/76802 430/271.1 |
| 2005/0186699 A1* | 8/2005 | Kawase | H01L 51/0021 438/99 |
| 2006/0054352 A1* | 3/2006 | Ryu | H05K 1/185 174/260 |
| 2009/0294157 A1* | 12/2009 | Lee | H01L 51/5203 174/256 |
| 2009/0314525 A1* | 12/2009 | Kajino | H05K 3/4682 174/255 |
| 2010/0206471 A1* | 8/2010 | Nakamura | B32B 37/025 156/247 |
| 2010/0255429 A1* | 10/2010 | Ishikawa | H01L 21/0273 430/324 |
| 2011/0220397 A1* | 9/2011 | Mizukoshi | H01L 24/83 174/251 |
| 2011/0220895 A1* | 9/2011 | Hirai | H01L 29/7869 257/57 |
| 2011/0244183 A1* | 10/2011 | Goto | C23C 18/30 428/145 |
| 2012/0220086 A1* | 8/2012 | Baars | H01L 21/823814 438/199 |
| 2013/0207093 A1 | 8/2013 | Jeong et al. | |
| 2013/0240852 A1* | 9/2013 | Yamazaki | H01L 51/5228 257/40 |
| 2014/0014400 A1 | 1/2014 | Mori et al. | |
| 2014/0101935 A1* | 4/2014 | Lee | H05K 3/00 29/846 |
| 2014/0139294 A1* | 5/2014 | Harasaka | H03B 17/00 331/1 R |
| 2014/0238954 A1* | 8/2014 | Matsumiya | C08G 18/61 216/67 |
| 2015/0145816 A1 | 5/2015 | Ueda et al. | |
| 2015/0179578 A1* | 6/2015 | Jezewski | H01L 21/31144 257/768 |
| 2016/0044777 A1 | 2/2016 | Seong et al. | |
| 2016/0204126 A1* | 7/2016 | Amano | H01L 27/124 257/59 |
| 2016/0343665 A1* | 11/2016 | Jezewski | H01L 21/31111 |
| 2016/0345430 A1 | 11/2016 | Khan et al. | |
| 2018/0204651 A1 | 7/2018 | Okamoto et al. | |

FOREIGN PATENT DOCUMENTS

| | | |
|---|---|---|
| CN | 104303240 A | 1/2015 |
| JP | 2003-69173 A | 3/2003 |
| JP | 2007-266312 A | 10/2007 |
| JP | 2009-241597 A | 10/2009 |
| JP | 5406991 B2 | 2/2014 |
| JP | 2014-191806 A | 10/2014 |
| JP | 2017-19207 A | 1/2017 |
| KR | 10-2004-0086838 A | 10/2004 |
| KR | 10-2005-0033971 A | 4/2005 |
| KR | 10-2015-0016119 A | 2/2015 |
| KR | 10-2016-6001829 A | 1/2016 |
| KR | 10-1685069 B1 | 12/2016 |
| KR | 10-2017-0037254 A | 4/2017 |
| KR | 10-2017-0141743 A | 12/2017 |
| WO | WO 2010/093009 A1 | 8/2010 |
| WO | WO 2017/010521 A1 | 1/2017 |

OTHER PUBLICATIONS

International Search Report for PCT/KR2019/002782 dated Jun. 18, 2019.

\* cited by examiner

[Figure 1]
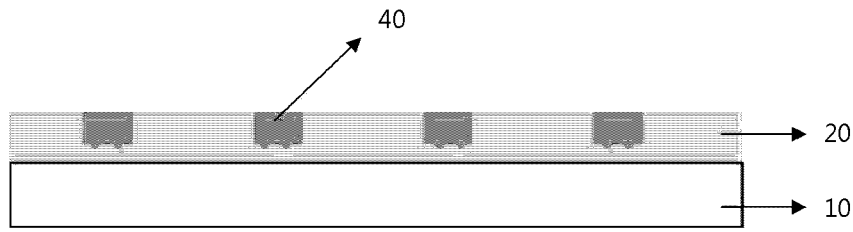
[Figure 2]
1) FORM BONDING LAYER AND METAL FOIL ON TRANSPARENT BASE
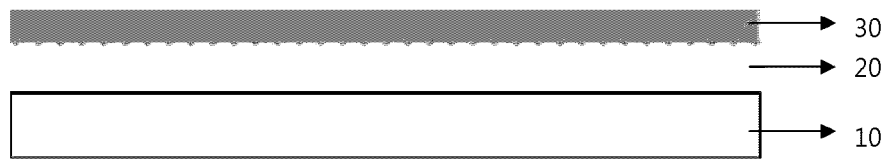
2) FORM METAL FOIL PATTERN
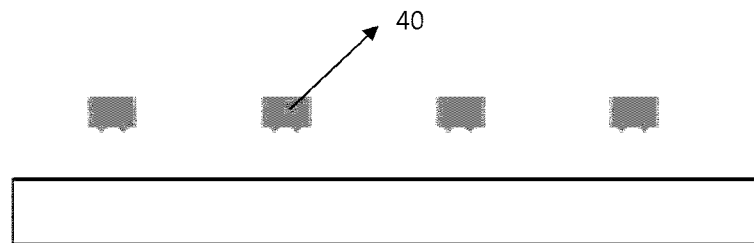
3) PERFORM HEAT TREATMENT AT TEMPERATURE OF 70℃ to 100℃
4) COMPLETELY CURE BONDING LAYER

[Figure 3]
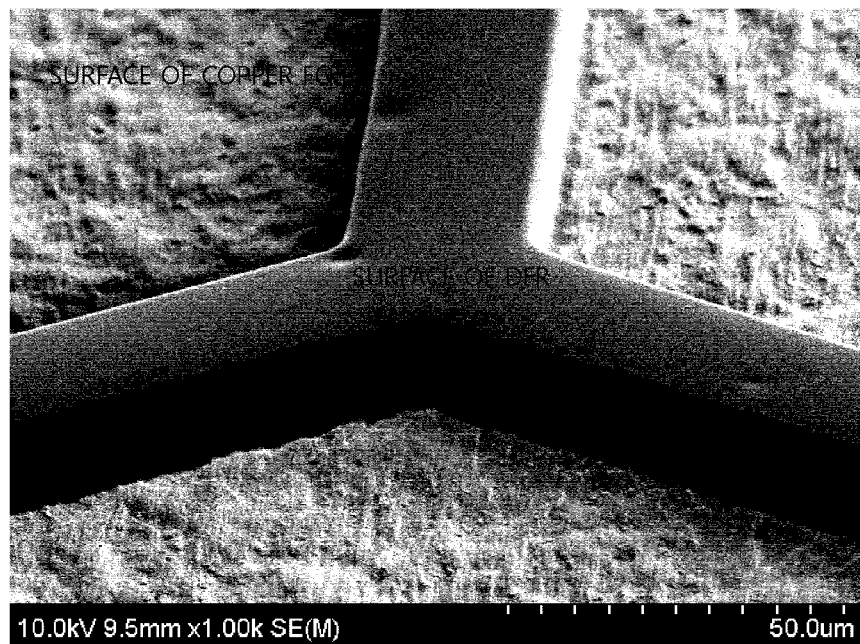
[Figure 4]
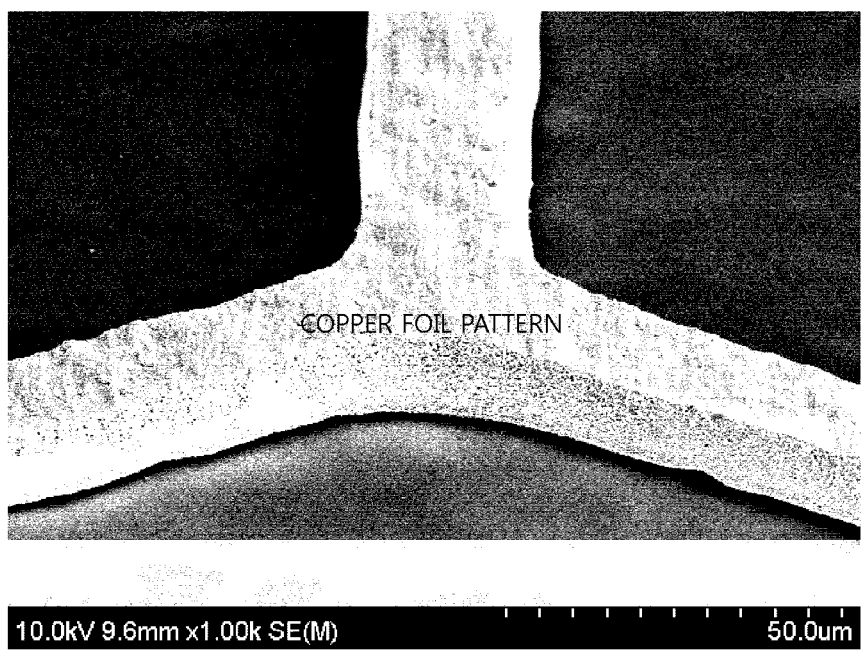

[Figure 5]
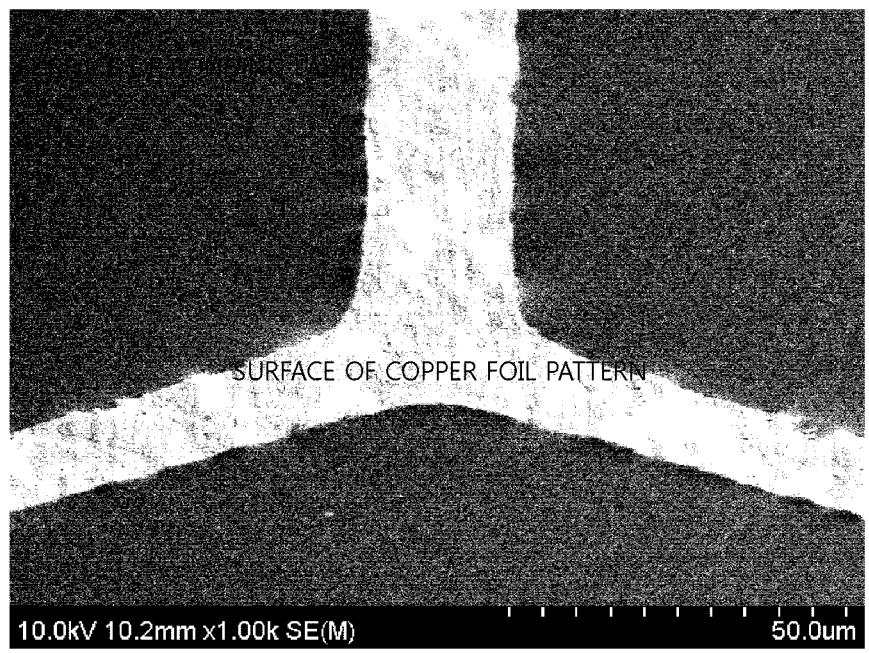
[Figure 6]
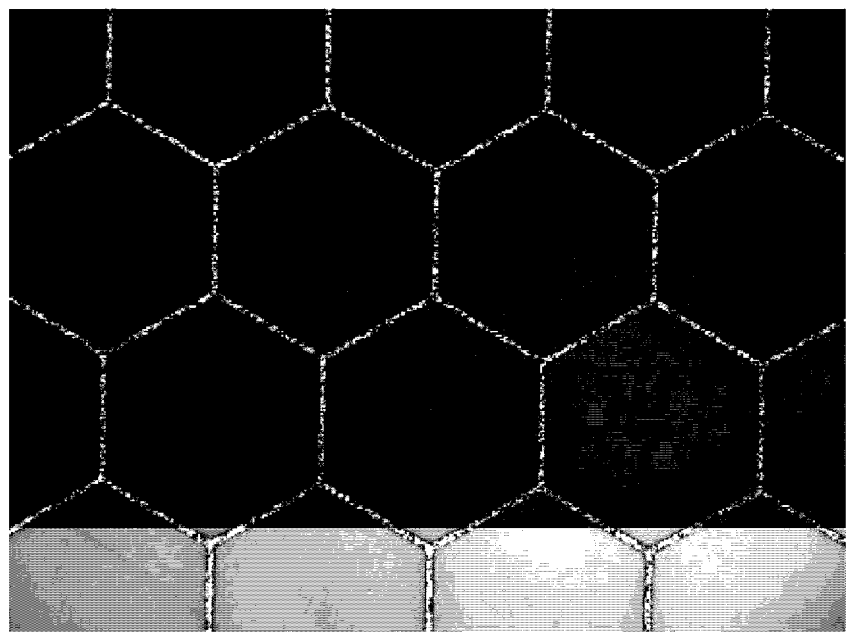

[Figure 7]
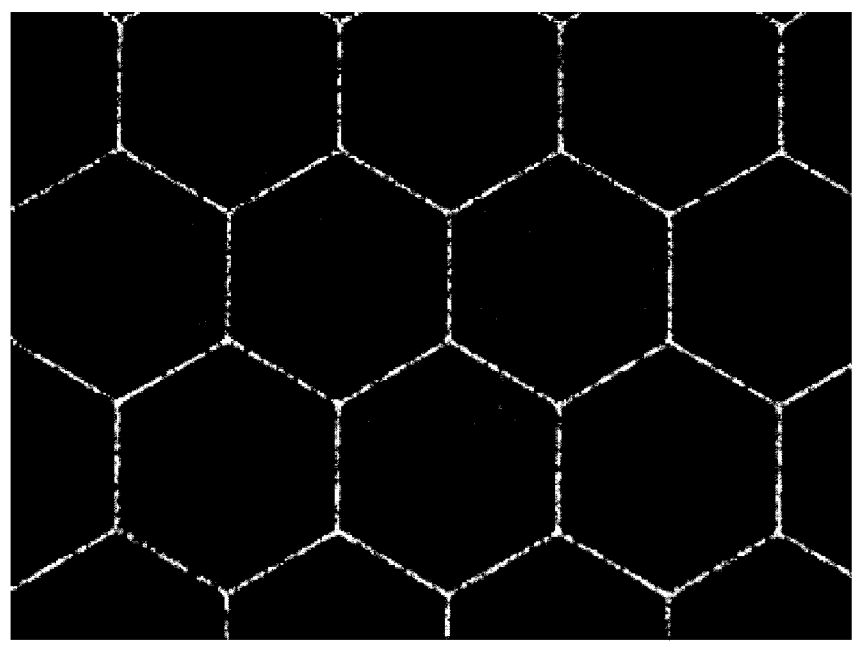

EMBEDDED-TYPE TRANSPARENT ELECTRODE SUBSTRATE AND METHOD FOR MANUFACTURING SAME

TECHNICAL FIELD

This application claims priority to and the benefit of Korean Patent Application No. 10-2018-0029686 filed with the Korean Intellectual Property Office on Mar. 14, 2018, the entire contents of which are incorporated herein by reference.

The present application relates to an embedded transparent electrode substrate and a method of manufacturing the same.

BACKGROUND ART

Recently, in Korea, information and spectacles are being provided to urban people by presenting various landscape lighting in parks and downtown areas as well as gorgeous signboards through fusion of cutting-edge ICT technologies and LED technologies. In particular, a transparent LED display made of an ITO transparent electrode material is formed by applying an LED between sheets of glass or attaching a transparent film, to which the LED is applied, to one surface of glass. There is an advantage in that a luxurious appearance may be produced because no electric wire is visible. As a result, the transparent LED display is used for interior design of hotels, department stores, and the like, and the importance of the transparent LED display is being increased in terms of implementing media facades on outer walls of buildings.

Demands for the transparent electrodes, which are transparent and used for touch screens or the like because electric current flow through the transparent electrodes, are being explosively increased along with the spread of smart devices. The most widely used transparent electrode is made of indium tin oxide (ITO) which is an oxide of indium and tin. Indium is a main material of the ITO transparent electrode, but the amount of indium reserves is not available globally, and indium is produced only in some countries such as China, such that production cost of indium is high. In addition, there is a disadvantage in that the displayed LED light is not constant because a resistance value is not constantly applied. For this reason, the transparent LED using the ITO has a limitation in being used as a high-performance and low-cost transparent electrode element.

The ITO as a transparent electrode material has been the most widely used but has a limitation in terms of economic feasibility, limited performances, and the like, and as a result, researches and technology development using new materials are being continuously carried out. As transparent electrode materials which attract attention as next-generation and new materials, there are metal meshes, nanowires (Ag nanowires), carbon nanotubes (CNTs), conductive polymers, graphene, and the like. The metal mesh, among the transparent electrode materials, is a new material that occupies 85% of materials substituting for ITO, and the market of the metal mesh is expanding in terms of utilization thereof because the metal mesh is low in price and has high conductivity.

The transparent LED display using the metal mesh is easier to maintain than the ITO transparent display in the related art, may save resources and significantly prevent environmental pollution, and is economical because manufacturing costs are reduced. In addition, the metal mesh may be widely applied as new transparent electrode material for various purposes, such that the metal mesh has the potential for application and utilization in various products.

DETAILED DESCRIPTION OF THE INVENTION

Technical Problem

An object of the present application is to provide an embedded transparent electrode substrate and a method of manufacturing the same.

Technical Solution

An exemplary embodiment of the present application provides a method of manufacturing an embedded transparent electrode substrate, the method comprising: forming a structure comprising a transparent base, a bonding layer provided on the transparent base, and a metal foil provided on the bonding layer; forming a metal foil pattern by patterning the metal foil; heat-treating the structure comprising the metal foil pattern at a temperature of 70° C. to 100° C.; and completely curing the bonding layer.

In addition, another exemplary embodiment of the present application provides an embedded transparent electrode substrate comprising: a transparent base; a bonding layer provided on the transparent base; and a metal foil pattern embedded in the bonding layer, in which one surface of the bonding layer and one surface of the metal foil pattern are provided on the same plane, ten-point average roughness Rz of a surface of the metal foil pattern opposite to the transparent base is higher than 0.5 µm, and a haze in a region of the embedded transparent electrode substrate where no metal foil pattern is provided, is 3% or less.

Advantageous Effects

According to the exemplary embodiment of the present application, the metal foil pattern is formed by using the low-cost metal foil, such that it is possible to reduce raw material costs when manufacturing the transparent electrode substrate. In particular, according to the exemplary embodiment of the present application, the metal foil pattern is formed on the bonding layer, and then the heat treatment is performed at a temperature of 70° C. to 100° C., such that the embedded transparent electrode substrate in which the metal foil pattern is embedded in the bonding layer may be manufactured without a process of applying a separate pressure.

In addition, according to the exemplary embodiment of the present application, the metal foil pattern is formed on the bonding layer, and then the heat treatment is performed at a temperature of 70° C. to 100° C., such that it is possible to prevent an increase in haze of the transparent electrode substrate in accordance with illumination intensity of a surface of the metal foil.

BRIEF DESCRIPTION OF DRAWINGS

FIG. 1 is a view schematically illustrating an embedded transparent electrode substrate according to an exemplary embodiment of the present application.

FIG. 2 is a view schematically illustrating a method of manufacturing the embedded transparent electrode substrate according to the exemplary embodiment of the present application.

FIGS. 3 to 6 are views illustrating an embedded transparent electrode substrate according to Example 1 of the present application.

FIG. 7 is a view illustrating an electrode substrate according to Comparative Example 1 of the present application.

DESCRIPTION OF REFERENCE NUMERALS

10: Transparent base
20: Bonding layer
30: Metal foil
40: Metal foil pattern

BEST MODE

Hereinafter, the present application will be described in detail.

In the present application, the term "transparent" means that transmittance is about 80% or higher in a visible ray region (400 nm to 700 nm).

Transmittance of 70% or higher and surface resistance of 0.5 ohm/sq or less need to be ensured in the case of a transparent electrode substrate applied to a transparent LED display having a transparent base on which metal wires are provided. A copper-deposited layer having low specific resistance needs to have a thickness of 1 μm or more in order to ensure the transmittance and the surface resistance. The copper-deposited layer having a thickness of 1 μm or more may be formed on the transparent base by using sputtering, evaporation, and plating processes, but in this case, high deposition costs may be incurred, attachment force of the copper-deposited layer may deteriorate, and the lower transparent base may be damaged during the deposition process.

In addition, in a case in which a low-cost copper foil and the transparent base are laminated by using a bonding agent, the manufacturing costs may be greatly reduced, and the attachment force may be improved. However, there is a problem in that a haze at an opening is increased as surface roughness of the copper foil is transferred onto a surface of the bonding agent.

In addition, in order to manufacture an embedded electrode having excellent surface flatness, a method of additionally applying a resin layer onto a transparent base having an electrode pattern and then removing a residual resin layer existing on the electrode or a method of forming an electrode pattern on a release base, applying a resin layer onto the electrode pattern, curing the resin layer, and transferring the electrode to the resin layer may be used, but in this case, there is a problem in that the process is complicated and manufacturing costs are increased.

Therefore, the present application provides an embedded transparent electrode substrate and a method of manufacturing the same in which an ultra-low-cost metal foil is used as a metal layer in order to ensure price competitiveness, and a haze of the transparent electrode substrate may be improved.

A method of manufacturing an embedded transparent electrode substrate according to an exemplary embodiment of the present application comprises: forming a structure comprising a transparent base, a bonding layer provided on the transparent base, and a metal foil provided on the bonding layer; forming a metal foil pattern by patterning the metal foil; heat-treating the structure comprising the metal foil pattern at a temperature of 70° C. to 100° C.; and completely curing the bonding layer.

The method of manufacturing the embedded transparent electrode substrate according to the exemplary embodiment of the present application comprises the forming of the structure comprising the transparent base, the bonding layer provided on the transparent base, and the metal foil provided on the bonding layer.

The forming of the structure may comprise: forming the bonding layer on the metal foil and forming the transparent base on the bonding layer; or forming the bonding layer on the transparent base and forming the metal foil on the bonding layer.

The transparent base may be, but not limited to, a glass base or a transparent plastic base which is excellent in transparency, surface smoothness, tractability, and waterproofness, and the transparent base is not limited as long as the transparent base is typically used for electronic elements. Specifically, the transparent base may be made of: glass; urethane resin; polyimide resin; polyester resin; (meth) acrylate-based polymeric resin; or polyolefin-based resin such as polyethylene or polypropylene. In addition, the transparent base may be a film having visible light transmittance of 80% or more, such as a film made of polyethylene terephthalate (PET), cyclic olefin polymer (COP), polyethylene naphthalate (PEN), polyethersulfone (PES), polycarbonate (PC), or acetyl celluloid. A thickness of the transparent base may be, but not limited only to, 25 μm to 250 μm.

The metal foil may be made of a material known in this technical field, and more specifically, the metal foil may comprise, but not limited only to, a copper (Cu) foil or an aluminum (Al) foil. A thickness of the metal foil may be 2 μm to 20 μm. A height of the metal foil pattern may be measured by a micrometer or a thickness gauge.

A refractive index of the bonding layer may be 1.45 to 1.55, and the bonding layer may have fluidity at a temperature of 70° C. or more. In addition, the bonding layer may comprise a heat-curable bonding agent composition or a UV-curable bonding agent composition.

More specifically, the bonding layer may comprise, but not limited only to, silane-modified epoxy resin, bisphenol A-type phenoxy resin, an initiator, and a silane coupling agent.

The bonding layer may be formed by using the above-mentioned bonding agent composition and a method such as comma coating or slot die coating so as to have a thickness of 5 μm to 30 μm, but the present invention is not limited thereto.

The method of manufacturing the embedded transparent electrode substrate according to the exemplary embodiment of the present application comprises the forming of the metal foil pattern by patterning the metal foil.

As the method of forming the metal foil pattern, a method known in this technical field may be used, and for example, a photolithography process may be used. More specifically, the method of forming the metal foil pattern may comprise, but not limited to, forming a resist pattern on the metal foil and then etching the metal foil, and stripping off the resist pattern.

The metal foil pattern may be manufactured from a metal foil comprising at least one matt surface having relatively high ten-point average roughness Rz. In this case, the matt surface of the metal foil is opposite to the transparent base.

The metal foil patterns may comprise two or types of metal foil patterns having different line widths. In addition, the metal foil patterns may comprise two types of metal foil patterns having different line widths, a line width of one of the metal foil patterns may be 3 μm to 30 μm, and a line width of the other of the metal foil patterns may be 50 μm or more. The metal foil pattern having the line width of 3 μm to 30 μm may serve as an electrode pattern, and the metal foil pattern having the line width of 50 μm or more may serve as an electrode pad pattern for connecting an external terminal. That is, the metal foil patterns may comprise the electrode pattern and the electrode pad pattern.

The line width of the electrode pattern may be, but not limited only to, 3 μm to 30 μm, 3 μm to 20 μm, or 3 μm to 10 μm. In addition, the line width of the electrode pad pattern may be, but not limited only to, 50 μm or more, or 50 μm to 1,000 μm.

The method of manufacturing the embedded transparent electrode substrate according to the exemplary embodiment of the present application comprises the heat-treating of the structure comprising the metal foil pattern at a temperature of 70° C. to 100° C.

The metal foil pattern may be embedded in the bonding layer by the heat-treating of the structure at the temperature of 70° C. to 100° C. In particular, according to the exemplary embodiment of the present application, the metal foil pattern is formed on the bonding layer, and then the heat treatment is performed at the temperature of 70° C. to 100° C., such that the embedded transparent electrode substrate in which the metal foil pattern is embedded in the bonding layer may be manufactured without a process of applying a separate pressure.

In addition, ten-point average roughness Rz of a surface of the bonding layer may be higher than 0.5 μm before the heat-treating of the structure, and ten-point average roughness Rz of the surface of the bonding layer may be 0.1 μm or less after the heat-treating of the structure. In addition, the ten-point average roughness Rz of the surface of the bonding layer may be higher than 0.5 μm and lower than 3 μm before the heat-treating of the structure. In addition, the ten-point average roughness Rz of the surface of the bonding layer may be 0 to 0.1 μm after the heat-treating of the structure. The metal foil has unique and high reflectance because of small unevenness when the Rz of the surface of the bonding layer is 0.5 μm or less before the heat-treating of the structure. Therefore, because it is difficult to decrease reflectance of the transparent electrode substrate manufactured as described above, there is a problem in that the pattern is easily visible by the eyes because of high reflectance. In addition, when the Rz of the surface of the bonding layer is 0.5 μm or less before the heat-treating of the structure, there may be a problem in that attachment force between the metal foil and the bonding layer is decreased, such that the metal foil pattern is eliminated from the bonding layer during the process (photo process) of forming the metal foil pattern.

That is, in a case in which the bonding layer is provided on the transparent base and then the low-cost metal foil is laminated, there may be a problem in that surface roughness of the metal foil is transferred to the surface of the bonding layer, such that a haze of a final product is increased. Therefore, according to the exemplary embodiment of the present application, the metal foil pattern is formed on the bonding layer, and then the heat treatment is performed at the temperature of 70° C. to 100° C., such that it is possible to prevent an increase in haze of the transparent electrode substrate in accordance with illumination intensity of a metal foil surface.

The method of manufacturing the embedded transparent electrode substrate according to the exemplary embodiment of the present application comprises the completely curing of the bonding layer. The bonding layer may comprise a heat-curable bonding agent composition or a UV-curable bonding agent composition, and the completely curing of the bonding layer may comprise thermally curing or UV-curing the bonding layer at a temperature of 120° C. or more.

In addition, the method of manufacturing the embedded transparent electrode substrate according to the exemplary embodiment of the present application is schematically illustrated in FIG. 2.

As illustrated in FIG. 2, the method of manufacturing the embedded transparent electrode substrate according to the exemplary embodiment of the present application comprises: forming a structure comprising a transparent base 10, a bonding layer 20 provided on the transparent base 10, and a metal foil 30 provided on the bonding layer 20; forming a metal foil pattern 40 by patterning the metal foil 30; heat-treating the structure comprising the metal foil pattern 40 at a temperature of 70° C. to 100° C.; and completely curing the bonding layer 20.

In addition, the exemplary embodiment of the present application provides an embedded transparent electrode substrate comprising: a transparent base; a bonding layer provided on the transparent base; and a metal foil pattern embedded in the bonding layer, in which one surface of the bonding layer and one surface of the metal foil pattern are provided on the same plane, ten-point average roughness Rz of a surface of the metal foil pattern opposite to the transparent base is higher than 0.5 μm, and a haze in a region of the embedded transparent electrode substrate where no metal foil pattern is provided, is 3% or less.

The transparent base, the bonding layer, and the metal foil pattern of the embedded transparent electrode substrate according to the exemplary embodiment of the present application are identical to those described above.

In the exemplary embodiment of the present application, a level difference between one surface of the bonding layer and one surface of the metal foil pattern, which are provided on the same plane, may be 0 to 20 μm.

In the exemplary embodiment of the present application, a refractive index of the bonding layer may be 1.45 to 1.55, and ten-point average roughness Rz of a surface of the metal foil pattern opposite to the transparent base may be 0.5 μm or more.

In addition, a haze in a region of the embedded transparent electrode substrate where no metal foil pattern is provided, may be 3% or less.

In addition, the embedded transparent electrode substrate according to the exemplary embodiment of the present application is schematically illustrated in FIG. 1.

As illustrated in FIG. 1, the embedded transparent electrode substrate according to the exemplary embodiment of the present application comprises: the transparent base 10; the bonding layer 20 provided on the transparent base 10; and the metal foil pattern 40 embedded in the bonding layer 20, in which one surface of the bonding layer 20 and one surface of the metal foil pattern 40 are provided on the same plane.

The embedded transparent electrode substrate according to the exemplary embodiment of the present application may be applied to a transparent electrode for an electronic element.

The electronic element may be a heat generating film, a transparent LED display, a touch panel, a solar cell, or a transistor. The heat generating film, the transparent LED display, the touch panel, the solar cell, or the transistor may be generally known in the art, and the electrode may be used for the transparent electrode substrate according to the exemplary embodiment of the present application.

MODE FOR INVENTION

Hereinafter, the exemplary embodiment disclosed in the present specification will be described with reference to examples. However, the scope of the exemplary embodiment is not intended to be limited by the following examples.

EXAMPLES

Example 1

A UV-curable bonding agent was applied onto a PET film having a thickness of 250 μm by using a comma coater and then dried with hot blast at 100° C. for 5 minutes to form a bonding layer having a thickness of 15 μm. In this case, the UV-curable bonding agent comprised silane-modified epoxy resin KSR-277HMC70 (Kukdo Chemical) of 33 wt. %, silane-modified epoxy resin KSR-177 (Kukdo Chemical) of 35 wt. %, bisphenol A-type phenoxy resin YP-50E (Kukdo Chemical) of 30 wt. %, a positive ion initiator Irgacure 290 (BASF) of 1 wt. %, and a silane coupling agent KBM-403 (Shinetsu) of 1 wt. %.

The PET film having the transparent bonding layer and a copper foil having a thickness of 8 μm were hot-roll-laminated under a condition of 100° C. and 1.3 mpm (meter per minute).

A dry film resist (DFR) was laminated on a surface of the copper foil of the copper-foil-laminated film, and then a hexagonal DFR pattern having a line width of 20 μm was formed through exposure and development processes.

The exposed copper foil was removed by using a ferric chloride-based copper etching liquid, and the DFR pattern was stripped off, such that a hexagonal copper foil pattern was formed. In this case, a haze in a region where no metal foil pattern is provided was 12.19%.

The copper foil pattern film was heat-treated at 100° C. for 5 minutes such that the copper foil pattern was embedded in the bonding layer, and then a surface opposite to a surface on which the copper foil pattern was provided was irradiated with UV rays with an exposure value of 2 J/cm2 to completely cure the bonding layer. In this case, a haze in a region where no metal foil pattern is provided was 2.86%.

The embedded transparent electrode substrate according to Example 1 of the present application is illustrated in FIGS. 3 to 6. More specifically, FIG. 3 illustrates the DFR pattern formed on a copper-foil-laminated raw sheet, FIG. 4 illustrates a state after the copper foil pattern is formed and the DFR is stripped off, and FIG. 5 illustrates a state after the heat treatment is performed. In addition, FIG. 6 illustrates the finally manufactured embedded transparent electrode substrate according to Example 1.

Comparative Example 1

A bonding agent for copper clad laminate (CCL) was applied onto a PET film having a thickness of 250 μm by using a comma coater and then dried with hot blast at 100° C. for 5 minutes to form a bonding layer having a thickness of 15 μm.

The PET film having the transparent bonding layer and a copper foil having a thickness of 8 μm were hot-roll-laminated under a condition of 100° C. and 1.3 mpm (meter per minute).

The copper-foil-laminated film was matured at 80° C. for 3 days to completely cure the bonding layer.

A dry film resist (DFR) was laminated on a surface of the copper foil of the copper-foil-laminated film, and then a hexagonal DFR pattern having a line width of 20 μm was formed through exposure and development processes.

The exposed copper foil was removed by using a ferric chloride-based copper etching liquid, and the DFR pattern was stripped off, such that a hexagonal copper foil pattern was formed. In this case, a haze in a region where no metal foil pattern is provided was 48.85%.

The electrode substrate according to Comparative Example 1 of the present application is illustrated in FIG. 7.

As shown in the above result, according to the exemplary embodiment of the present application, the metal foil pattern is formed by using the low-cost metal foil, such that it is possible to reduce raw material costs when manufacturing the transparent electrode substrate. In particular, according to the exemplary embodiment of the present application, the metal foil pattern is formed on the bonding layer, and then the heat treatment is performed at a temperature of 70° C. to 100° C., such that the embedded transparent electrode substrate in which the metal foil pattern is embedded in the bonding layer may be manufactured without a process of applying a separate pressure.

In addition, according to the exemplary embodiment of the present application, the metal foil pattern is formed on the bonding layer, and then the heat treatment is performed at a temperature of 70° C. to 100° C., such that it is possible to prevent an increase in haze of the transparent electrode substrate in accordance with illumination intensity of a surface of the metal foil.

The invention claimed is:

1. A method of manufacturing an embedded transparent electrode substrate, the method comprising:
   a) forming a structure comprising a transparent base, a bonding layer on a surface of the transparent base, and a metal foil on a surface of the bonding layer opposite the transparent base;
   b) forming a metal foil pattern by patterning the metal foil;
   c) heat-treating the structure resulting from b) at a temperature of 70° C. to 100° C.; and
   d) completely curing the bonding layer,
   wherein ten-point average roughness Rz of a surface of the bonding layer is higher than 0.5 μm before the heat-treating of the structure, and
   ten-point average roughness Rz of the surface of the bonding layer is 0.1 μm or less after the heat-treating of the structure.

2. The method of claim 1, wherein the forming of the structure comprises:
   forming the bonding layer on the metal foil and forming the transparent base on the bonding layer; or
   forming the bonding layer on the transparent base and forming the metal foil on the bonding layer.

3. The method of claim 1, wherein the metal foil pattern is embedded in the bonding layer by the heat-treating of the structure at the temperature of 70° C. to 100° C.

4. The method of claim 1, wherein the bonding layer has fluidity at a temperature of 70° C. or more.

5. The method of claim 1, wherein the bonding layer comprises a heat-curable bonding agent composition or a UV-curable bonding agent composition, and
   the completely curing of the bonding layer comprises thermally curing or UV-curing the bonding layer at a temperature of 120° C. or more.

6. The method of claim 1, wherein the bonding layer comprises silane-modified epoxy resin, bisphenol A-type phenoxy resin, an initiator, and a silane coupling agent.

7. The method of claim 1, wherein a thickness of the metal foil is 2 μm to 20 μm.

8. The method of claim 1, wherein the metal foil comprises a copper foil or an aluminum foil.

9. The method of claim 1, wherein the forming of the metal foil pattern uses a photolithography process.

\* \* \* \* \*

UNITED STATES PATENT AND TRADEMARK OFFICE
CERTIFICATE OF CORRECTION

| | |
|---|---|
| PATENT NO. | : 11,259,417 B2 |
| APPLICATION NO. | : 16/755540 |
| DATED | : February 22, 2022 |
| INVENTOR(S) | : Yong Goo Son et al. |

It is certified that error appears in the above-identified patent and that said Letters Patent is hereby corrected as shown below:

On the Title Page

Please replace:
"(30) Foreign Application Priority Data
Mar. 14, 2019   (KR)    10-2018-0029686"

With:
-- (30) Foreign Application Priority Data
Mar. 14, 2018   (KR)    10-2018-0029686 --

Signed and Sealed this
Twenty-fourth Day of May, 2022

Katherine Kelly Vidal
*Director of the United States Patent and Trademark Office*